US009625537B2

(12) United States Patent
Chang et al.

(10) Patent No.: US 9,625,537 B2
(45) Date of Patent: Apr. 18, 2017

(54) MAGNETIC FIELD SENSING DEVICE AND METHOD

(71) Applicants: Jui-Hang Chang, Taipei (TW); Ching-Ray Chang, Taipei (TW)

(72) Inventors: Jui-Hang Chang, Taipei (TW); Ching-Ray Chang, Taipei (TW)

(73) Assignees: Ching-Ray Chang, Taipei (TW); Jui-Hang Chang, Taipei (TW)

( * ) Notice: Subject to any disclaimer, the term of this patent is extended or adjusted under 35 U.S.C. 154(b) by 196 days.

(21) Appl. No.: 14/556,101

(22) Filed: Nov. 29, 2014

(65) Prior Publication Data

US 2015/0153426 A1 Jun. 4, 2015

(30) Foreign Application Priority Data

Nov. 29, 2013 (TW) ................................ 102143905 A

(51) Int. Cl.
*G01R 33/09* (2006.01)
(52) U.S. Cl.
CPC .................................. *G01R 33/098* (2013.01)
(58) Field of Classification Search
CPC ....... G01R 33/09; G01R 33/098; G11B 5/127
USPC .......................................................... 324/252
See application file for complete search history.

(56) References Cited

U.S. PATENT DOCUMENTS

| 5,632,092 | A  | * | 5/1997 | Blank ..................... | B60K 35/00 324/252 |
| 8,164,864 | B2 | * | 4/2012 | Kaiser .................... | B82Y 25/00 360/324.2 |
| 2003/0094944 | A1 | * | 5/2003 | Suzuki ................... | B82Y 25/00 324/252 |
| 2004/0184311 | A1 | * | 9/2004 | Sharma ................. | G01R 33/093 365/158 |
| 2005/0185346 | A1 | * | 8/2005 | Shoji ...................... | B82Y 25/00 360/324.1 |
| 2006/0002031 | A1 | * | 1/2006 | Shoji ...................... | G11B 5/127 360/313 |
| 2007/0211393 | A1 | * | 9/2007 | Gill ........................ | B82Y 25/00 360/324.12 |
| 2011/0007560 | A1 | * | 1/2011 | Dieny ................... | B82Y 25/00 365/171 |
| 2012/0212217 | A1 | * | 8/2012 | Engel ................... | G01R 33/098 324/252 |

(Continued)

FOREIGN PATENT DOCUMENTS

TW 201305587 A 10/2013

*Primary Examiner* — Jay Patidar
*Assistant Examiner* — Alvaro Fortich
(74) *Attorney, Agent, or Firm* — The PL Law Group, PLLC

(57) ABSTRACT

The present invention discloses a magnetic field sensing device and method. The magnetic field sensing device includes a pinned layer with a first magnetization direction, an analyzer with a second magnetization direction, wherein the first and the second magnetization directions form an angle, and a sensing layer of magnetic material, located between the analyzer and the pinned layer. The magnetic field sensing method includes: providing a pinned layer with a first magnetization direction, providing an analyzer with a second magnetization direction, wherein the first and the second magnetization directions form an angle, and providing a sensing layer of magnetic material, located between the analyzer and the pinned layer.

11 Claims, 5 Drawing Sheets

(56) References Cited

U.S. PATENT DOCUMENTS

2013/0134969 A1* 5/2013 Ohta .................... G01R 33/093
          324/252

* cited by examiner

MAGNETIC FIELD SENSING DEVICE AND METHOD

CROSS-REFERENCE TO RELATED APPLICATION AND CLAIM OF PRIORITY

This application claims the benefit of Taiwan Patent Application No. 102143905, filed on Nov. 29, 2013, at the Taiwan Intellectual Property Office, the entire disclosure of which is incorporated herein by reference.

FIELD OF THE INVENTION

The invention relates to a magnetic field sensing device and method, and more particularly to a magnetic tunnel junction sensor and a method utilizing a magnetic tunnel junction to sense a magnetic field.

BACKGROUND OF THE INVENTION

Two structures were previously proposed for magnetic field sensors utilizing magnetic tunnel junctions. One structure measures the external magnetic field in the horizontal direction, and the other measures the external magnetic field in the vertical direction, as shown in FIGS. 1A and 1B respectively. The magnetic field sensors in FIGS. 1A and 1B both include a reference layer (also called pinned layer) 110, a spacer 120, a sensing layer (also called free layer) 130, and the magnetization directions of the reference layer 110 and the sensing layer 130 are mutually perpendicular under zero external magnetic field. M represents the magnetization vector of the sensing layer 130. To measure the external magnetic field $H_{ext}$ in the horizontal direction (the xz-plane), the direction of the magnetization vector $M_p$ of the reference layer 110 of the magnetic field sensor in FIG. 1A is along the horizontal direction (x axis in the figure), and the easy axis 140 of the sensing layer 130 is along the y (vertical coordinate) direction. The external magnetic field $H_{ext}$ pushes M away from the easy axis 140 between the parallel (P) and anti-parallel (AP) configurations, producing an output tunnel magnetoresistance (TMR) signal, which is read out with the aid of $M_p$. To measure the external magnetic field $H_{ext}$ in the vertical direction, the direction of the magnetization vector $M_p$ of the reference layer 110 of the magnetic field sensor in FIG. 1B is along the y direction, and the easy axis 150 of the sensing layer 130 is along the x direction. Similarly, the external magnetic field $H_{ext}$ in the vertical direction pushes M away from the easy axis 150 between the parallel (P) and anti-parallel (AP) configurations, producing an output TMR signal, which is read out with the aid of $M_p$. It is very inconvenient practically, because two different structures are needed to measure the horizontal component and the vertical component of the same magnetic field.

In order to overcome the drawbacks in the prior art, a magnetic field sensing device and method is disclosed. The purpose of the present invention is to provide a magnetic field sensing device and method that can detect an external magnetic field in both the horizontal and vertical directions with one structure, which is practically convenient. The particular design in the present invention not only solves the problems described above, but also is easy to implement. Thus, the present invention has utility for the industry.

SUMMARY OF THE INVENTION

In accordance with one aspect of the present invention, a magnetic field sensor is disclosed. The magnetic field sensor includes: a pinned layer having a first magnetization direction; an analyzing layer having a second magnetization direction, wherein the first magnetization direction and the second magnetization direction form an angle; and a magnetic sensing layer configured between the pinned layer and the analyzing layer.

In accordance with another aspect of the present invention, a magnetic field sensor is disclosed. The magnetic field sensor includes: a pinned layer having a first magnetization direction; an analyzing layer having a second magnetization direction; and a sensing layer configured between the pinned layer and the analyzing layer, and having an easy axis, wherein the second magnetization direction and the easy axis form an angle.

In accordance with another aspect of the present invention, a magnetic field sensing device is disclosed. The magnetic field sensing device includes: a magnetic field sensor detecting a magnitude and a direction of a magnetic field on a horizontal plane and a magnitude of the magnetic field in a vertical direction; and a current changing device electrically connected to the magnetic field sensor, wherein when the current changing device is in a first working state, the magnetic field sensor measures on the horizontal plane, and when the current changing device is in a second working state, the magnetic field sensor measures in the vertical direction.

In accordance with another aspect of the present invention, a magnetic field sensing method is disclosed. The magnetic field sensing method includes: providing a pinned layer having a first magnetization direction; providing an analyzing layer having a second magnetization direction, wherein the first magnetization direction and the second magnetization direction form an angle; and providing a magnetic sensing layer configured between the pinned layer and the analyzing layer.

In accordance with another aspect of the present invention, a magnetic field sensing method is disclosed. The magnetic field sensing method includes: providing a pinned layer having a first magnetization direction; providing an analyzing layer having a second magnetization direction; and providing a sensing layer configured between the pinned layer and the analyzing layer, and having an easy axis, wherein the second magnetization direction and the easy axis form an angle.

In accordance with another aspect of the present invention, a magnetic field sensing method is disclosed. The magnetic field sensing method includes: providing a magnetic field sensor measuring a magnitude and detecting a direction of a magnetic field on a horizontal plane and a magnitude of the magnetic field in a vertical direction; and electrically connecting a current changing device to the magnetic field sensor, wherein when the current changing device is in a first working state, the magnetic field sensor measures on the horizontal plane, and when the current changing device is in a second working state, the magnetic field sensor measures in the vertical direction.

Therefore, the present invention discloses a magnetic field sensing device and method that can detect the external magnetic field in both the horizontal and vertical directions with one structure, which is practically convenient.

The aspects and advantages of the present invention will become more readily apparent to those ordinarily skilled in the art after reviewing the following detailed descriptions and accompanying drawings.

DETAILED DESCRIPTION OF THE PREFERRED EMBODIMENT

The present invention will now be described more specifically with reference to the following embodiments. It is to be noted that the following descriptions of preferred embodiments of this invention are presented herein for purposes of illustration and description only; they are not intended to be exhaustive or to be limited to the precise form disclosed.

While the present invention is described with reference to the preferred embodiments and examples, it is to be understood that these examples are intended to be illustrative rather than in a limiting sense. It is contemplated that modifications and combinations will readily occur to those skilled in the art, and these modifications and combinations are within the spirit of this invention.

In addition, the present invention can be fully understood from the descriptions of the following embodiments, allowing persons skilled in the art to carry it out accordingly, but the following embodiments of the invention are set forth without any loss of generality to and without imposing limitations upon the claimed invention.

Figures 1A, 1B:
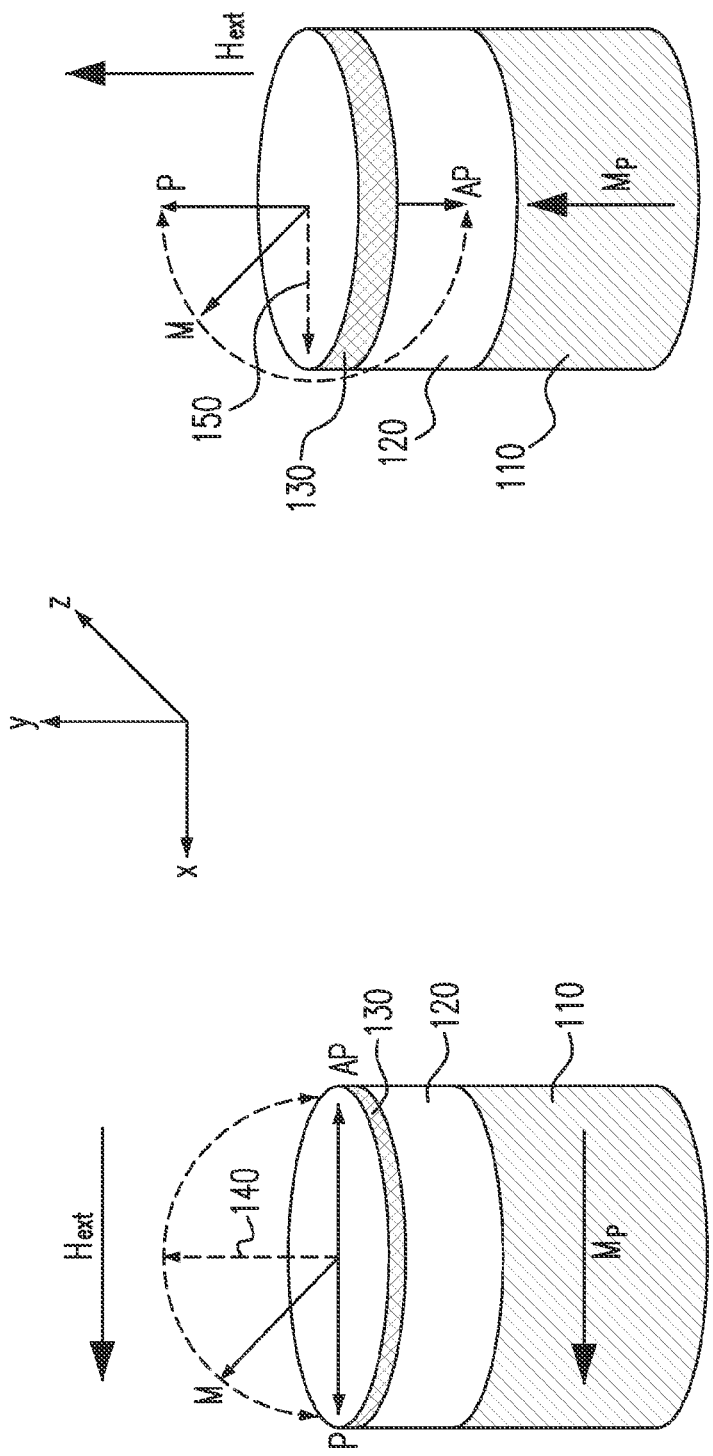
FIG. 1A and FIG. 1B show the previously proposed magnetic field sensors utilizing magnetic tunnel junctions in the prior art, in which there are two structures, one structure measures the external magnetic field in the horizontal direction, and the other measures the external magnetic field in the vertical direction, as shown in FIGS. 1A and 1B respectively.
Figure 2:
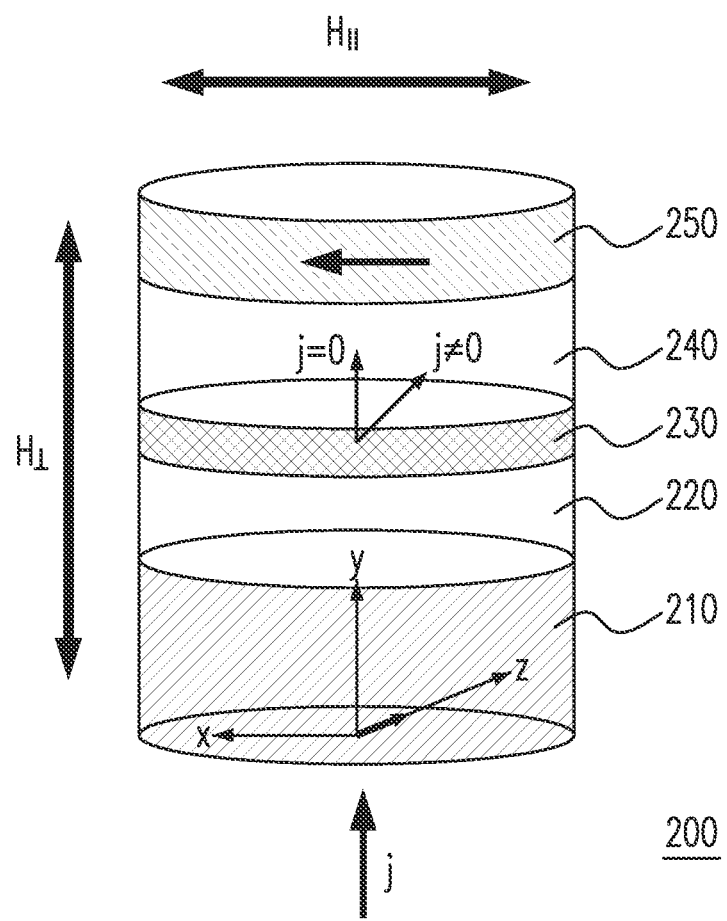
FIG. 2 shows an embodiment of a magnetic field sensor of the present invention.

Please refer to FIG. 2, which shows an embodiment of a magnetic field sensor 200 of the present invention. The magnetic field sensor 200 includes: a pinned layer 210, a first spacer 220, a magnetic sensing layer 230, a second spacer 240 and an analyzing layer 250. The magnetization direction of the pinned layer 210 is in the z direction (a horizontal direction). The magnetization directions of the analyzing layer 250 and the pinned layer 210 form an angle on the horizontal plane. Preferably, the angle is 90°, as shown in FIG. 2, in which the magnetization direction of the analyzing layer 250 is in the x direction. The magnetization directions of the pinned layer 210 and the analyzing layer 250 are basically fixed; i.e., they do not change with the external magnetic field.

The magnetic field sensor 200 can utilize a current changing device, which is electrically connected to the magnetic field sensor. The current changing device has two working states. When the current changing device is in a first working state, the magnetic field sensor can measure the magnitude and direction of the magnetic field on the horizontal plane, and when the current changing device is in a second working state, the magnetic field sensor can measure the magnetic field in the vertical direction. Preferably, the current changing device provides a direct current flowing through the magnetic field sensor. The direct current becomes a spin-polarized current when it flows through the pinned layer. The current density of the spin-polarized current is j. When the current changing device is in the first working state, j is zero and the easy axis of the magnetic sensing layer 230 is in the y direction (the vertical direction, perpendicular to the horizontal plane), and thus the magnetic field in the horizontal direction $H_\parallel$ can be measured. When the current changing device is in the second working state, j is not zero and the easy axis of the magnetic sensing layer 230 rotates (i.e., changes angle) on the xy-plane with the change of j. When the angle between the easy axis of the magnetic sensing layer 230 and the horizontal plane is not 90°, the magnetic field in the vertical direction $H_\perp$ can be measured. When the external magnetic field pushes the magnetization vector of the magnetic sensing layer 230 away from the easy axis, the angle θ between the magnetization vector of the magnetic sensing layer 230 and the magnetization direction of the analyzing layer 250 changes with the magnitude of the external magnetic field, thus changing the tunnel magnetoresistance (TMR).

Figure 3:
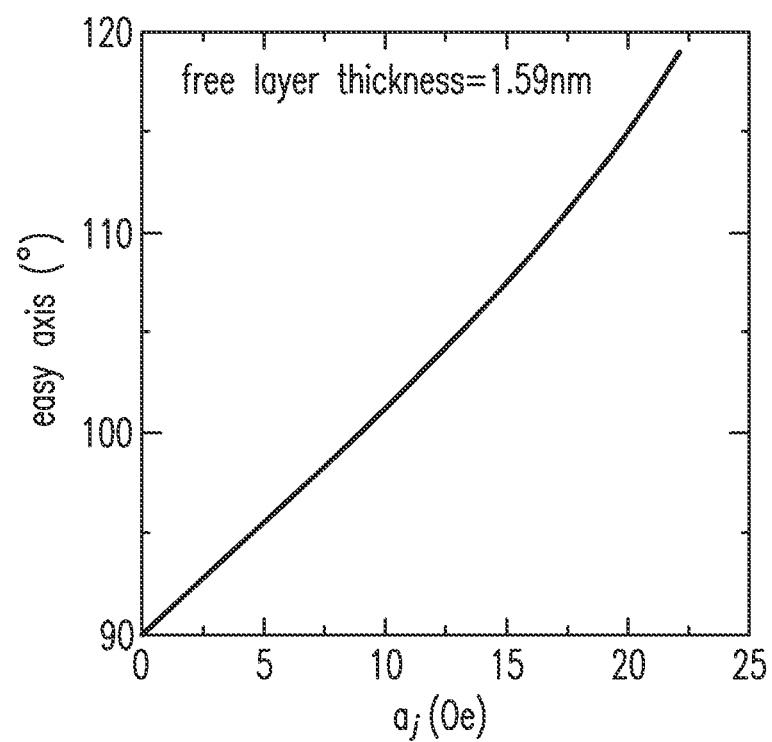
FIG. 3 shows the angle of the easy axis as a function of the spin torque magnitude $a_j$ caused by the spin-polarized current density j when the thickness of the magnetic sensing layer of a magnetic field sensor of the present invention is 1.59 nm.

FIG. 3 shows the angle of the easy axis as a function of the spin torque magnitude $a_j$ caused by j, when the thickness of the magnetic sensing layer 230 is 1.59 nm. The relationship is symmetric with respect to the y axis, and the maximum angle of the easy axis is related to the thickness of the magnetic sensing layer 230. In the example shown in FIG. 3, the maximum angle of the easy axis is about 120°, and the angle of the easy axis changes between about 90° and about 120°. The direction of the spin-polarized current density j can be reversed, with the characteristics of the magnetic field sensor the same.

Figure 4:
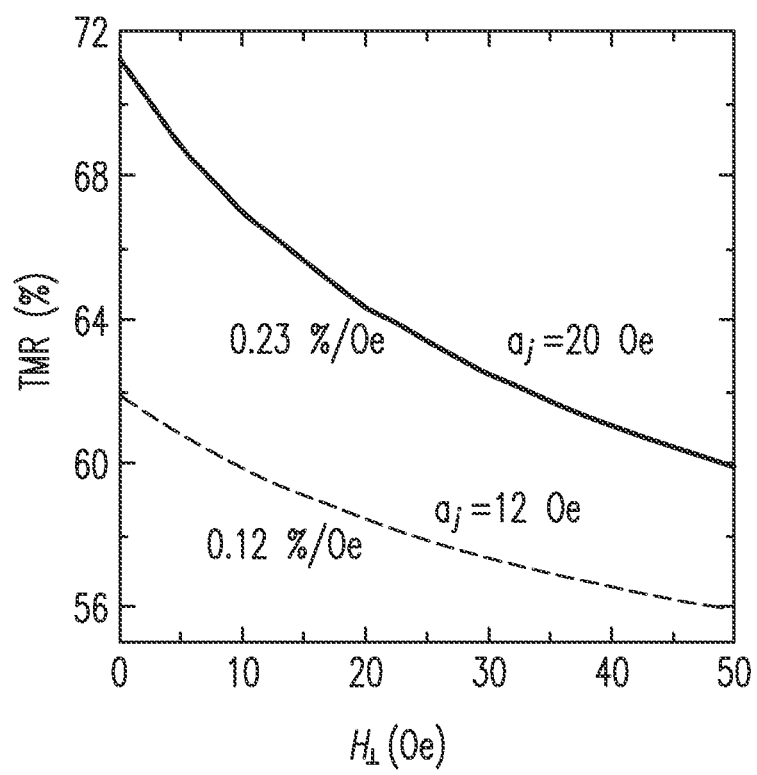
FIG. 4 shows an example of the relationship between the tunnel magnetoresistance (TMR) of a magnetic field sensor of the present invention and the magnitude of the external magnetic field in the vertical direction $H_\perp$.

For reliable magnetic field sensors, especially those measuring the earth's magnetic field, high sensitivity, linear response and being free of hysteresis in a small field sensing range are required. FIG. 4 shows an example of the relationship between the tunnel magnetoresistance (TMR) of the magnetic field sensor 200 and the magnitude of the external magnetic field in the vertical direction $H_\perp$. There is no hysteresis in FIG. 4. The figure shows how the tunnel magnetoresistance of the magnetic field sensor changes with $H_\perp$ for two different $a_j$s caused by different spin-polarized currents. The slope in the graph represents the sensitivity of the magnetic field sensor when measuring an external magnetic field in the vertical direction. Usually the higher the spin-polarized current density is, the higher the sensitivity.

Figure 5:
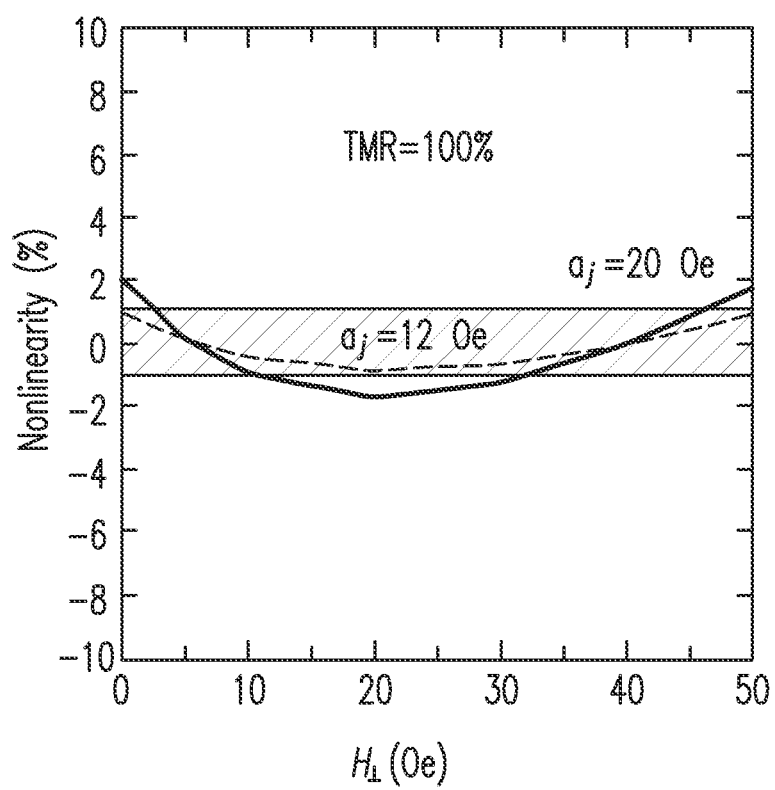
FIG. 5 shows an example of the relationship between the nonlinearity percentage of the magnetic field sensor and the magnitude of the external magnetic field in the vertical direction $H_\perp$.

FIG. 5 shows an example of the relationship between the nonlinearity percentage of the magnetic field sensor and the magnitude of the external magnetic field in the vertical direction $H_\perp$ for two different $a_j$s caused by different spin-polarized currents. It is usually considered tolerable for the nonlinearity percentage to be within ±1%. It is seen from the figure that the response of the magnetic field sensor may be closer to being linear when the spin-polarized current density is smaller. Therefore a balance has to be reached between the sensitivity and linearity, but a reasonably good magnetic field sensor can be obtained for an external magnetic field in the vertical direction based on the scheme of the present invention, while when the spin-polarized current is zero, the easy axis of the magnetic sensing layer 230 is in the vertical direction, and linear output TMR signal is produced for external magnetic field in the horizontal direction.

Therefore, the present invention discloses a very convenient magnetic field sensing device and magnetic field sensing method, which allow the detection of external magnetic fields in both the horizontal and vertical directions with one structure. With zero spin-polarized current, the magnetic field in the horizontal direction can be measured, and with the spin-polarized current applied, the magnetic field in the vertical direction can be measured.

The first spacer and the second spacer are non-magnetic layers, preferably, of one of a metal material and an oxide material, e.g., magnesium oxide or aluminum oxide. Metals allow the conduction of current, but non-metallic materials can result in higher sensitivity for the magnetic field sensor. Nevertheless, the non-metallic layer has to be very thin for the current to pass through.

Preferably, the pinned layer, the magnetic sensing layer and the analyzing layer are metallic magnetic layers.

Preferably, the thicknesses of the pinned layer, the magnetic sensing layer and the analyzing layer are different. The easy axis or magnetization direction of the magnetic sensing layer has to change direction with the change of the spin-polarized current or external magnetic field. This is more easily achieved with a thicker layer. Nevertheless, the thickness should not exceed the critical thickness, or otherwise the easy axis would be parallel to the xz-plane.

The magnetization directions of the pinned layer and the analyzing layer can be respectively determined by a first pinning layer adjacent to the pinned layer, and a second pinning layer adjacent to the analyzing layer. Preferably, the first and the second pinning layers are antiferromagnetic layers.

Embodiments

1. A magnetic field sensor comprises a pinned layer having a first magnetization direction; an analyzing layer having a second magnetization direction, wherein the first magnetization direction and the second magnetization direction form an angle; and a magnetic sensing layer configured between the pinned layer and the analyzing layer.
2. The magnetic field sensor of Embodiment 1 further comprises a first spacer and a second spacer, wherein the first spacer is configured between the pinned layer and the magnetic sensing layer, the second spacer is configured between the magnetic sensing layer and the analyzing layer, the magnetic sensing layer has an easy axis, there is a spin-polarized current when the spin-polarized current is zero, the easy axis is in a vertical direction perpendicular to both the first magnetization direction and the second magnetization direction, and when the spin-polarized current is not zero, the easy axis changes with the spin-polarized current so an angle between the easy axis and the vertical direction changes on a plane determined by the second magnetization direction and the vertical direction.
3. The magnetic field sensor of any one of Embodiments 1-2, wherein the first spacer and the second spacer are non-magnetic layers of one of a metal material and an oxide material.
4. The magnetic field sensor of any one of Embodiments 1-3, wherein the pinned layer, the magnetic sensing layer and the analyzing layer are metallic magnetic layers.
5. The magnetic field sensor of any one of Embodiments 1-4 further comprises a first and a second pinning layers, wherein the first and the second magnetization directions of the pinned layer and the analyzing layer are respectively determined by the first pinning layer adjacent to the pinned layer, and the second pinning layer adjacent to the analyzing layer.
6. The magnetic field sensor of any one of Embodiments 1-5, wherein the first and the second pinning layers are antiferromagnetic layers.
7. A magnetic field sensor comprises a pinned layer having a first magnetization direction; an analyzing layer having a second magnetization direction; and a sensing layer configured between the pinned layer and the analyzing layer, and having an easy axis, wherein the second magnetization direction and the easy axis form an angle.
8. A magnetic field sensing device comprises a magnetic field sensor detecting a magnitude and a direction of a magnetic field on a horizontal plane and a magnitude of the magnetic field in a vertical direction; and a current changing device electrically connected to the magnetic field sensor, wherein when the current changing device is in a first working state, the magnetic field sensor measures on the horizontal plane, and when the current changing device is in a second working state, the magnetic field sensor measures in the vertical direction.
9. The magnetic field sensing device of Embodiment 8, wherein the magnetic field sensor has a magnetic sensing layer, a pinned layer and an analyzing layer, the magnetic sensing layer is configured between the pinned layer and the analyzing layer, the magnetic sensing layer has an easy axis, the current changing device provides a direct current flowing through the magnetic field sensor, the direct current becomes a spin-polarized current when it flows through the pinned layer, the spin-polarized current is zero and the easy axis is in the vertical direction when the current changing device is in the first working state, and the spin-polarized current is not zero and the easy axis forms an angle with the vertical direction on a plane determined by a first horizontal direction and the vertical direction according to the spin-polarized current when the current changing device is in the second working state.
10. The magnetic field sensing device of Embodiment 8 or 9, wherein the analyzing layer has a first magnetization direction in the first horizontal direction, and the pinned layer has a second magnetization direction forming an angle with the first magnetization direction.
11. A magnetic field sensing method comprises providing a pinned layer having a first magnetization direction; providing an analyzing layer having a second magnetization direction, wherein the first magnetization direction and the second magnetization direction form an angle; and providing a magnetic sensing layer configured between the pinned layer and the analyzing layer.
12. A magnetic field sensing method comprises providing a pinned layer having a first magnetization direction; providing an analyzing layer having a second magnetization direction; and providing a sensing layer configured between the pinned layer and the analyzing layer, and having an easy axis, wherein the second magnetization direction and the easy axis form an angle.
13. A magnetic field sensing method comprises providing a magnetic field sensor measuring a magnitude and detecting a direction of a magnetic field on a horizontal plane and a magnitude of the magnetic field in a vertical direction; and electrically connecting a current changing device to the magnetic field sensor, wherein when the current changing device is in a first working state, the magnetic field sensor measures on the horizontal plane, and when the current changing device is in a second working state, the magnetic field sensor measures in the vertical direction.

While the invention has been described in terms of what is presently considered to be the most practical and preferred embodiments, it is to be understood that the invention needs not be limited to the disclosed embodiments. Therefore, it is intended to cover various modifications and similar configuration included within the spirit and scope of the appended claims, which are to be accorded with the broadest interpretation so as to encompass all such modifications and similar structures.

What is claimed is:

1. A magnetic field sensor for measuring an external magnetic field, comprising:
   a pinned layer having a first magnetization direction;
   an analyzing layer having a second magnetization direction, wherein the second magnetization direction is free from changing with the external magnetic field, and the first magnetization direction and the second magnetization direction form a coordinate system for a horizontal plane parallel to the pinned layer; and
   a magnetic sensing layer configured between the pinned layer and the analyzing layer.

2. The magnetic field sensor as claimed in claim 1, further comprising a first spacer and a second spacer, wherein the first spacer is configured between the pinned layer and the magnetic sensing layer, the second spacer is configured between the magnetic sensing layer and the analyzing layer, the magnetic sensing layer has an easy axis, there is a spin-polarized current when the spin-polarized current is zero, the easy axis is in a vertical direction perpendicular to both the first magnetization direction and the second magnetization direction, and when the spin-polarized current is not zero, the easy axis changes with the spin-polarized current so an angle between the easy axis and the vertical direction changes on a plane determined by the second magnetization direction and the vertical direction.

3. The magnetic field sensor as claimed in claim 2, wherein each of the first spacer and the second spacer is a non-magnetic layer being one of a metal material and an oxide material.

4. The magnetic field sensor as claimed in claim 1, wherein the pinned layer, the magnetic sensing layer and the analyzing layer are metallic magnetic layers.

5. The magnetic field sensor as claimed in claim 1, further comprising a first and a second pinning layers, wherein the first and the second magnetization directions of the pinned layer and the analyzing layer are respectively determined by the first pinning layer adjacent to the pinned layer, and the second pinning layer adjacent to the analyzing layer.

6. The magnetic field sensor as claimed in claim 5, wherein the first and the second pinning layers are antiferromagnetic layers.

7. A magnetic field sensing device, comprising:
   a magnetic field sensor detecting a magnitude and a direction of a magnetic field on a horizontal plane and a magnitude of the magnetic field in a vertical direction, wherein the magnetic field sensor has a single structure; and
   a current changing device electrically connected to the magnetic field sensor, wherein when the current changing device is in a first working state, the single structure measures on the horizontal plane, and when the current changing device is in a second working state, the single structure measures in the vertical direction.

8. The magnetic field sensing device as claimed in claim 7, wherein the magnetic field sensor has a magnetic sensing layer, a pinned layer and an analyzing layer, the magnetic sensing layer is configured between the pinned layer and the analyzing layer, the magnetic sensing layer has an easy axis, the current changing device provides a direct current flowing through the magnetic field sensor, the direct current becomes a spin-polarized current when it flows through the pinned layer, the spin-polarized current is zero and the easy axis is in the vertical direction when the current changing device is in the first working state, and the spin-polarized current is not zero and the easy axis forms an angle with the vertical direction on a plane determined by a first horizontal direction and the vertical direction according to the spin-polarized current when the current changing device is in the second working state.

9. The magnetic field sensing device as claimed in claim 8, wherein the analyzing layer has a first magnetization direction in the first horizontal direction, and the pinned layer has a second magnetization direction forming an angle with the first magnetization direction.

10. A magnetic field sensing method for measuring an external magnetic field, comprising:
    providing a pinned layer having a first magnetization direction;
    providing an analyzing layer having a second magnetization direction, wherein the second magnetization direction is free from changing with the external magnetic field, and the first magnetization direction and the second magnetization direction form a coordinate system for a horizontal plane parallel to the pinned layer; and
    providing a magnetic sensing layer configured between the pinned layer and the analyzing layer.

11. A magnetic field sensing method, comprising:
    providing a magnetic field sensor measuring a magnitude and detecting a direction of a magnetic field on a horizontal plane and measuring a magnitude of the magnetic field in a vertical direction, wherein the magnetic field sensor has a single structure; and
    electrically connecting a current changing device to the single structure, wherein when the current changing device is in a first working state, the magnetic field sensor measures on the horizontal plane, and when the current changing device is in a second working state, the single structure measures in the vertical direction.

* * * * *